United States Patent
Fujisawa et al.

(10) Patent No.: US 7,426,711 B2
(45) Date of Patent: Sep. 16, 2008

(54) MASK PATTERN DATA FORMING METHOD, PHOTOMASK AND METHOD OF MANUFACTURING SEMICONDUCTOR DEVICE

(75) Inventors: Tadahito Fujisawa, Yokkaichi (JP); Takeshi Ito, Yokohama (JP); Takashi Obara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 219 days.

(21) Appl. No.: 11/357,034

(22) Filed: Feb. 21, 2006

(65) Prior Publication Data

US 2007/0195295 A1     Aug. 23, 2007

(30) Foreign Application Priority Data

Feb. 21, 2005   (JP)   ............................. 2005-044257

(51) Int. Cl.
  *G06F 17/50*   (2006.01)
(52) U.S. Cl. ............................................ 716/19; 716/21
(58) Field of Classification Search .................. 716/19, 716/21

See application file for complete search history.

(56) References Cited

U.S. PATENT DOCUMENTS

| | | | |
|---|---|---|---|
| 6,819,405 B2* | 11/2004 | Mulkens et al. | 355/75 |
| 6,828,080 B2 | 12/2004 | Nakao | |
| 6,885,433 B2 | 4/2005 | Shiraishi | |
| 6,897,942 B2 | 5/2005 | Shiraishi | |
| 6,977,714 B2* | 12/2005 | Finders | 355/52 |
| 7,100,145 B2* | 8/2006 | Shi et al. | 716/19 |
| 7,107,573 B2* | 9/2006 | Yamazoe et al. | 716/21 |
| 7,145,199 B2* | 12/2006 | Kajimoto et al. | 257/314 |
| 7,233,386 B2* | 6/2007 | Reisinger et al. | 355/55 |
| 7,286,206 B2* | 10/2007 | Shiozawa | 355/53 |
| 2006/0038292 A1* | 2/2006 | Minami et al. | 257/750 |
| 2006/0077702 A1* | 4/2006 | Sugimae et al. | 365/63 |
| 2006/0093926 A1* | 5/2006 | Fujisawa et al. | 430/5 |
| 2006/0246362 A1* | 11/2006 | Yasuzato | 430/5 |
| 2007/0117231 A1* | 5/2007 | Suga | 438/14 |
| 2007/0121090 A1* | 5/2007 | Chen et al. | 355/67 |
| 2007/0170589 A1* | 7/2007 | Kato et al. | 257/758 |
| 2007/0238038 A1* | 10/2007 | Fukuhara | 430/30 |

FOREIGN PATENT DOCUMENTS

| | | |
|---|---|---|
| JP | 4-101148 | 4/1992 |
| JP | 4-180612 | 6/1992 |
| JP | 2006227514 A * | 8/2006 |

\* cited by examiner

*Primary Examiner*—Paul Dinh
*Assistant Examiner*—Patrick Sandoval
(74) *Attorney, Agent, or Firm*—Oblon, Spivak, McClelland, Maier & Neustadt, P.C.

(57) ABSTRACT

There is disclosed a mask pattern data forming method comprising arranging patterns with a minimum pitch in parallel or vertically in an X or Y direction, where directions diagonally connected with respect to respective centers of gravity of the double-pole or the quadrupole illumination are defined as the X and Y direction, classifying patterns or pattern groups with a pitch larger than the patterns with the minimum pitch into a pattern type with a pitch whose exposure margin is larger than that of the patterns with the minimum pitch and a pattern type with a pitch whose exposure margin is smaller than that of the patterns with the minimum pitch; and arranging patterns or pattern groups classified into the pattern type whose exposure margin is smaller than that of the patterns with the minimum pitch in a direction deflected by 45° or 135° from the patterns with the minimum pitch.

3 Claims, 8 Drawing Sheets

MASK PATTERN DATA FORMING METHOD, PHOTOMASK AND METHOD OF MANUFACTURING SEMICONDUCTOR DEVICE

CROSS-REFERENCE TO RELATED APPLICATIONS

This application is based upon and claims the benefit of priority from prior Japanese Patent Application No. 2005-044257, filed Feb. 21, 2005, the entire contents of which are incorporated herein by reference.

BACKGROUND OF THE INVENTION

1. Field of the Invention

The present invention relates to a method of forming mask pattern data to be used for high-precisely transferring a micropattern in projection exposure using double-pole illumination or quadrupole illumination, a photomask manufactured by using the mask pattern data forming method, and a method of manufacturing a semiconductor device using the photomask.

2. Description of the Related Art

In recent years, a resolution close to a theoretical limitation determined on the basis of a wavelength of light has been required accompanying the miniaturization of a device pattern. Various phase shift masks have been proposed as a photomask toward the request. Further, as an exposure apparatus, a grazing-incidence illuminating system exposure apparatus by which a light incident into a photomask is illuminated so as to be inclined from the optical axis by an angle corresponding to a numerical aperture of a projection exposure apparatus has been proposed. Moreover, an exposure system in which a phase shift mask and a grazing-incidence illuminating system are combined has been under review.

In particular, in a memory device, extreme miniaturization has been required for patterns arranged in a specific direction in a cell array (for example, in an X direction or a Y direction). In order to realize the request, it has attracted attention that a double-pole illumination method or a quadrupole illumination method is used in a grazing-incidence illuminating system (for example, refer to Jpn. Pat. Appln. KOKAI Publication Nos. 4-101148 and 4-180612). A high resolution and an exposure margin are improved by using double-pole illumination and quadrupole illumination for patterns with a minute pitch of a cell array.

However, in double-pole illumination and quadrupole illumination, there is the problem that the resolution and the depth of focus (DOF) with respect to patterns with a pitch which is greater to some extent than those of patterns randomly arrayed in a device pattern and of patterns of a cell array. Namely, although an exposure margin with respect to a cell array is improved by using double-pole illumination and quadrupole illumination, there is the problem that an exposure margin is low with respect to a complex layout pattern. As a complex layout pattern, there is representatively an interconnecting wiring pattern for connecting a cell array portion and a core region or a peripheral region which has a relatively loose pitch, but includes a complex pattern layout.

In this way, conventionally, when double-pole illumination or quadrupole illumination is used, a degradation in an exposure margin with respect to an interconnecting wiring pattern from a memory cell array to a peripheral region, and in particular, with respect to an interconnecting wiring pattern from a minute pitch region of a cell array to an eased pitch region at the peripheral portion has become a big problem.

BRIEF SUMMARY OF THE INVENTION

According to a first aspect of the present invention, there is provided a mask pattern data forming method for forming pattern data of a photomask to be used for projection exposure by double-pole illumination or quadrupole illumination in which a light source intensity is concentrated in a double pole or quadrupole form, the method comprising:

arranging patterns with a minimum pitch in the pattern data in parallel or vertically in an X direction or a Y direction, where directions diagonally connected with respect to respective centers of gravity of the double-pole illumination or the quadrupole illumination are defined as the X direction and the Y direction, classifying patterns or pattern groups with a pitch larger than the patterns with the minimum pitch into a pattern type with a pitch whose exposure margin is larger than that of the patterns with the minimum pitch and a pattern type with a pitch whose exposure margin is smaller than that of the patterns with the minimum pitch; and arranging patterns or pattern groups classified into the pattern type whose exposure margin is smaller than that of the patterns with the minimum pitch in a direction deflected by 45° or 135° from the patterns with the minimum pitch.

According to a second aspect of the present invention, there is provided a photomask which is used for projection exposure by double-pole illumination or quadrupole illumination in which a light source intensity is concentrated in a double-pole or quadrupole form, wherein patterns with a minimum pitch in the pattern data are formed in parallel or vertically in an X direction or a Y direction, where directions diagonally connected with respect to respective centers of gravity of the double-pole illumination or the quadrupole illumination are defined as the X direction and the Y direction, patterns or pattern groups with a pitch larger than the patterns with the minimum pitch are classified into a pattern type with a pitch whose exposure margin is larger than that of the patterns with the minimum pitch and a pattern type with a pitch whose exposure margin is smaller than that of the patterns with the minimum pitch; and patterns or pattern groups which are classified into the pattern type whose exposure margin is smaller than that of the patterns with the minimum pitch are arranged in a direction deflected by 45° or 135° from the patterns with the minimum pitch.

According to a third aspect of the present invention, there is provided a method of manufacturing a semiconductor device, comprising:

preparing a photomask recited in the second aspect;

forming a resist film on a semiconductor substrate; and carrying out projection exposure of a pattern formed on the photomask onto the resist film by illuminating the photomask by a double-pole or quadrupole illumination.

DETAILED DESCRIPTION OF THE INVENTION

Figure 1:
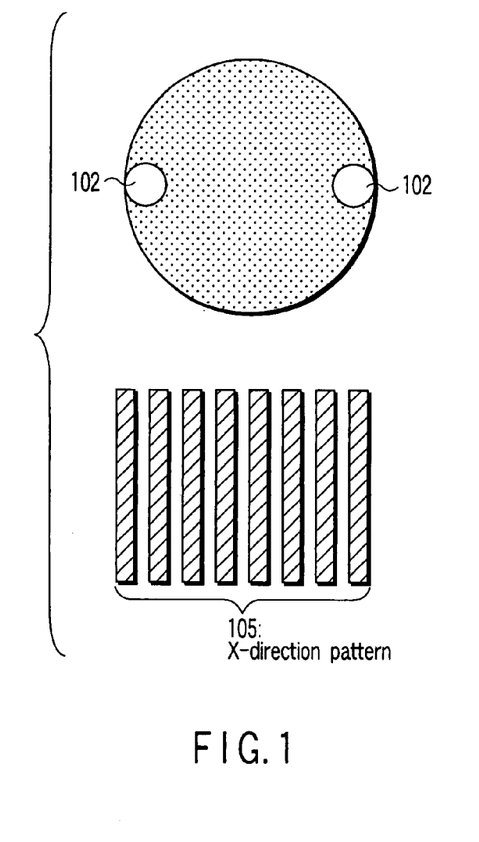
FIG. 1 is a view showing a preferred illumination scheme (a pupil plane of a light source) with respect to an array direction of patterns of a cell array.
Figure 2:
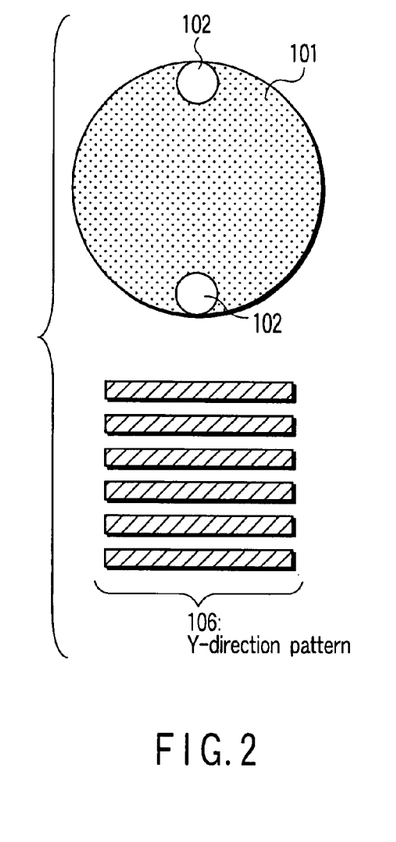
FIG. 2 is a view showing a preferred illumination scheme (a pupil plane of a light source) with respect to an array direction of patterns of a cell array.
Figure 3:
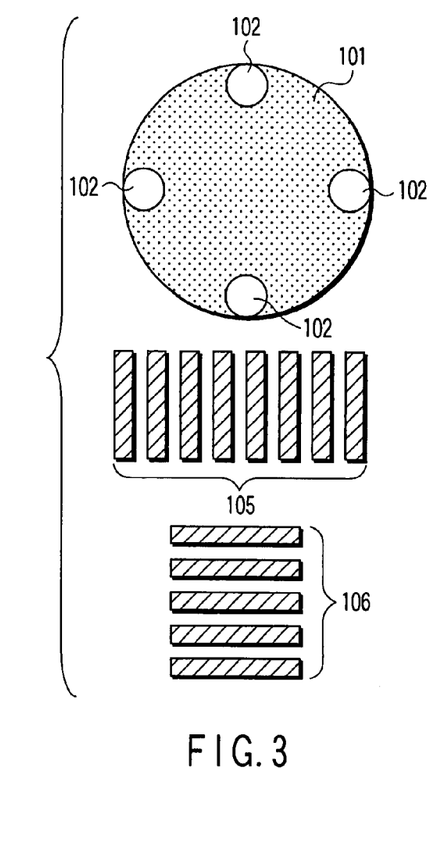
FIG. 3 is a view showing a preferred illumination scheme (a pupil plane of a light source) with respect to array directions of patterns of a cell array.

Before the description of embodiments of the present invention, double-pole illumination and quadrupole illumination, and pattern layout examples suitable for applying these illuminations thereto will be described. FIG. 1 to FIG. 3 are views each showing a concrete example of a preferred illumination scheme corresponding to an array direction of pattern layout of a cell array. In FIG. 1 to FIG. 3, reference numeral 101 denotes a light source plane (pupil plane), 102 denotes light sources, 105 denotes patterns arrayed in the X direction, and 106 denotes patterns arrayed in the Y direction.

FIG. 1 shows a double-pole illumination scheme which is set to be optimum for patterns arrayed in the X direction, and FIG. 2 shows a double-pole illumination scheme which is set to be optimum for patterns arrayed in the Y direction. FIG. 3 shows a quadrupole illumination scheme which is set to be optimum for the both patterns arrayed in the X direction and the Y direction. Although the exposure margin in the example of FIG. 3 is inferior to those of FIGS. 1 and 2, the miniaturization thereof can be enhanced so as to approach the limitation of resolution of an exposure apparatus with respect to both of the patterns in the X direction and the Y direction.

As described previously, in double-pole illumination and quadrupole illumination, there is the problem that the resolution and the depth of focus (DOF) at a pattern region having a pitch which is somewhat greater than that of a random layout portion in a device pattern and a cell array are low. Then, the inventors have solved the problem by arranging a pattern layout direction.

Hereinafter, the embodiments of the present invention will be described with reference to the drawings.

First Embodiment

In projection exposure by quadrupole illumination in which light of a light source is concentrated in a quadrupole form, there is a demand to dissolve the shortage of an exposure margin for patterns with an intermediate pitch in an interconnecting wiring portion ranging from a cell array to a peripheral circuit. For this purpose, the inventors have devised a mask pattern forming method for forming a mask pattern in a direction in which a layout direction of patterns in an interconnecting wiring portion is displaced by 45° or 135° with respect to a layout direction of patterns of a cell array.

More specifically, the inventors have paid attention on patterns whose margins are degraded in the wiring portion ranging from a gate wiring of the cell array of a NAND type flash memory to a fringe pattern formed at the peripheral circuit, and found a solution.

Figure 4:
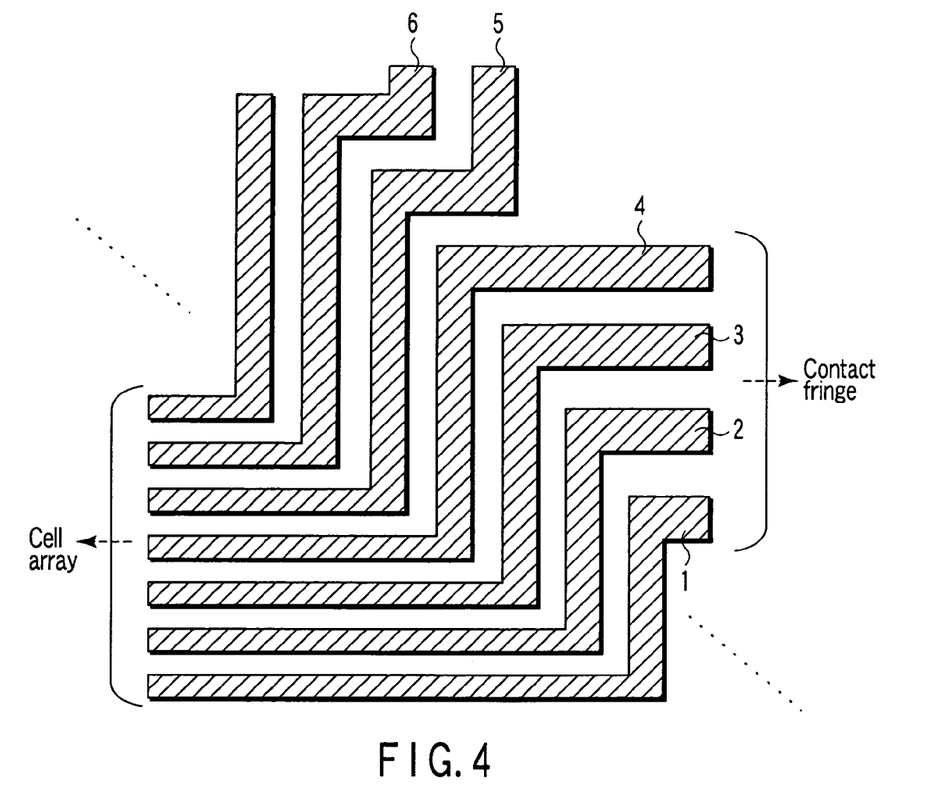
FIG. 4 is a view showing an example of a design pattern (interconnecting wiring pattern) for connecting a gate cell pattern of a NAND type flash memory to a contact fringe pattern.

FIG. 4 shows an example of a design pattern of an interconnection wiring portion of a NAND type flash memory, and specifically, shows an example of the design pattern of the interconnecting wiring portion from a gate cell pattern (not shown) to a contact fringe pattern (not shown). The fringe pattern is used to pass a contact pattern. Reference numerals 1 to 6 in FIG. 4 denote the design pattern of the interconnecting wiring portion.

A cell portion (not shown) formed of an L/S pattern with a half pitch of 71 nm is provided in the left side portion of the pattern layout of FIG. 4, and a contact fringe pattern (not shown) of a peripheral circuit is provided in the right side portion of the pattern layout of FIG. 4. The L/S patterns with a half pitch of 71 nm led from the cell portion in the horizontal direction are once deflected in the vertical direction and changed to have sizes with a half pitch of 120 nm, and are further deflected in the horizontal direction again and changed to have sizes with a half pitch of 140 nm. In the pattern layout of FIG. 4, the hatching parts show half-tone parts in which a light transmission of the mask is 6%, and the outline parts of the hatching parts show light transmittable parts.

Figure 5:
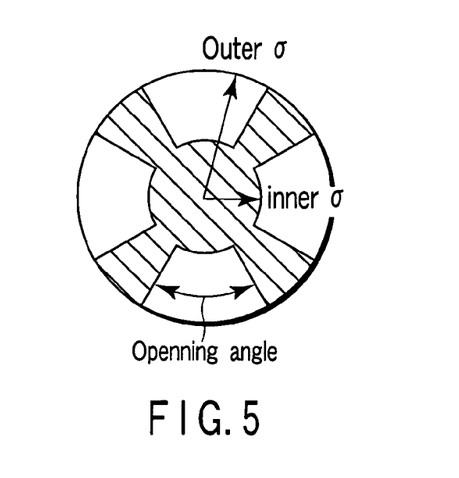
FIG. 5 is a view showing an example of a light source (illumination condition) suitable for a cell array formed of a line/space pattern (L/S pattern) of 71 nm half pitch.

FIG. 5 shows an example of an illumination condition (light source shape) suitable for resolving the cell portion formed of an L/S pattern with a half pitch of 71 nm. Under the illumination condition shown in FIG. 5, the resolution of cell array patterns arranged in the X direction or the Y direction is made maximum when an ArF excimer laser exposure apparatus with exposure wavelength of 193 nm and NA (numerical aperture)=0.83 is used. Moreover, from the standpoint that throughput in exposure processing is enhanced by assuring a large quantity of light, sector form type quadrupole illumination in which quadrupole illumination in a type of FIG. 3 is modified is applied. The illumination condition (light source shape) is that Inner σ=0.7, Outer σ=0.9, and an open angle of the sector is 40°.

Figure 6:
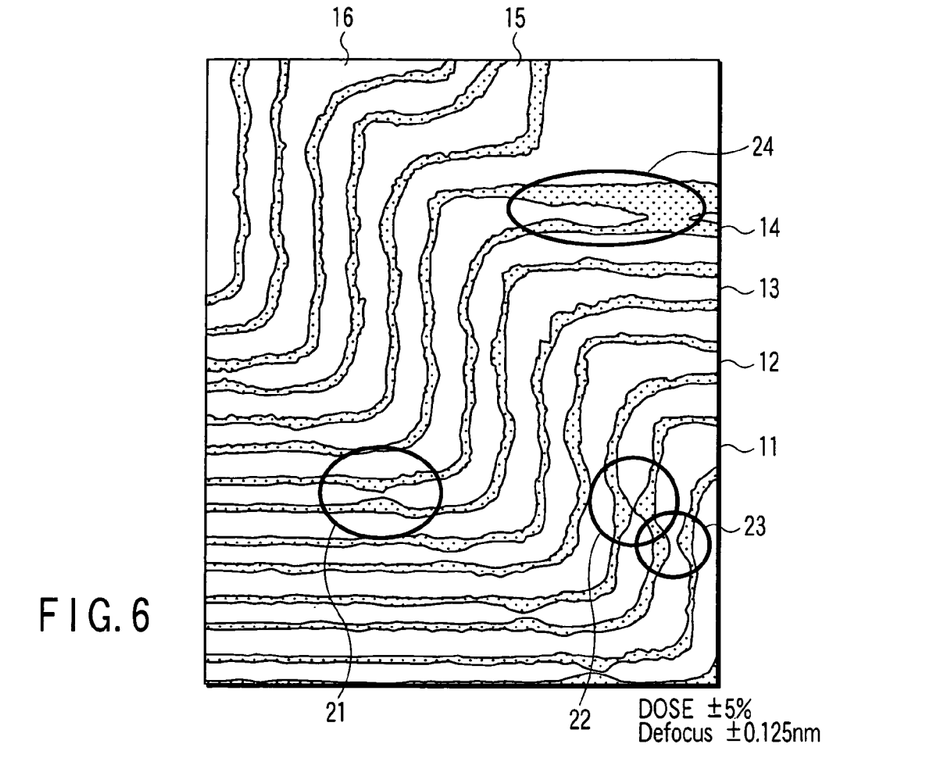
FIG. 6 is a view showing a simulation image of the interconnecting wiring pattern of FIG. 4 obtained by an image intensity simulation using the light source (illumination condition) of FIG. 5.

FIG. 6 shows a simulation image of the wiring patterns of FIG. 4 obtained under the illumination condition of FIG. 5 by using an image intensity simulation. The simulation image shown in FIG. 6 shows variations in line widths given that variation in dose is ±5% and variation in focus is ±125 nm as variable factors estimated in an actual exposure processing process when the cell portion is formed of an L/S pattern with 71 nm as the design. The variable factor is determined by estimating one generated due to dose (variations in sensitivity of a resist, variation in dimensions of a mask, or the like), and one generated due to focus (unevenness of a target layer, variation in focus of the exposure apparatus, or the like) among variable factors generated in exposure processing.

Reference numbers 11 to 16 in FIG. 6 denote a resist line portion corresponding to the interconnecting wirings 1 to 6 of the layout of FIG. 4. It is understood from the simulation image shown in FIG. 6 that short circuits and disconnection are respectively generated at the portions shown by 21 and 23 and at the portions shown by 22 and 24 of the wiring portion. Accordingly, it has been understood that the exposure margin at the wiring portion is low. Further, even when double-pole illumination is used in place of quadrupole illumination, the result has been in the same way.

The inventors have focused attention on the fact that, although it is necessary to ease a pattern size or a pitch in order to form, for example, a contact fringe, in double-pole illumination and quadrupole illumination, the image intensity of the patterns is largely degraded when a pitch of the patterns in the wiring portion is eased from a pitch of the cell portion to a pitch by which interference of light is changed from two beam interference to three beam interference. The inventors have found the fact that, with respect to the patterns at the wiring portion eased so as to have a pitch by which interference of light is changed from two-beam interference to three-beam interference, interference of light can be changed to be not three beam interference but two beam interference by forming the pattern in a direction at 45° or 135°, thereby enabling to avoid degradation in exposure margin.

Figure 7:
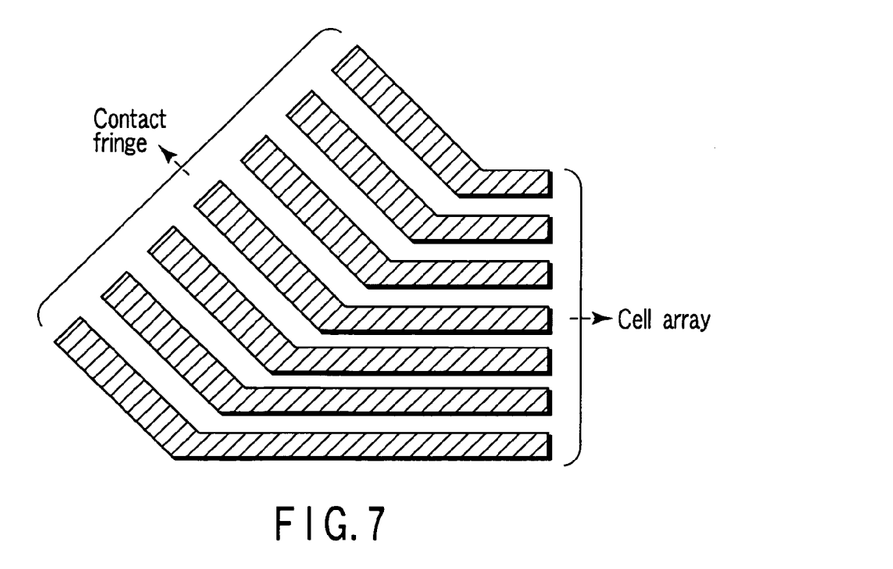
FIG. 7 is a view showing an example of an interconnecting wiring pattern according to a first embodiment of the present invention.

FIG. 7 shows an example of a pattern layout in the wiring portion for solving the above-described problem. A cell portion (not shown) formed of an L/S pattern with a half pitch of 71 nm is provided in the right side portion of the pattern layout of FIG. 7, and a contact fringe pattern (not shown) of a peripheral circuit is provided in the left side portion of the pattern layout of FIG. 7. The L/S pattern with a half pitch of 71 nm led from the cell portion in the horizontal direction is deflected by 45° and changed to have a size with a half pitch of 120 nm. In the same way as in FIG. 4, the hatching parts in the pattern layout show half-tone parts in which a light transmission of the mask is 6%, and outline parts of the hatching portions show light transmittable parts.

Figure 8:
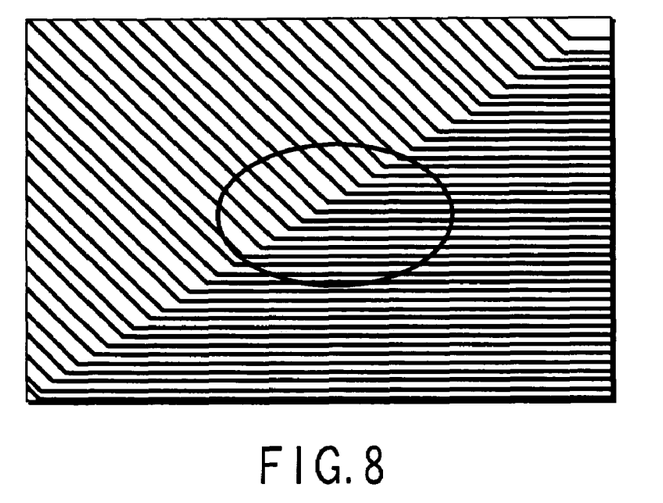
FIG. 8 is a view showing a simulation image of the interconnecting wiring pattern layout of FIG. 7 obtained by an image intensity simulation using the light source (illumination condition) of FIG. 5.
Figure 9:
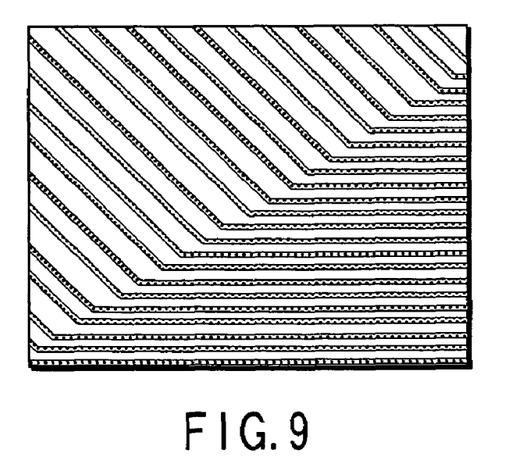
FIG. 9 is an enlarged view showing a part of the simulation image of FIG. 8, which is circled in FIG. 8.

FIG. 8 shows, in the same way as in FIG. 6, a simulation image of the patterns in the connecting wiring section shown in FIG. 4 obtained under the illumination condition of FIG. 5 by using an image intensity simulation. Also, in the same way as in FIG. 6, the simulation image shown in FIG. 8 shows variations in line widths given that variation in dose is ±5%, and variation in focus is ±125 nm as variable factors estimated in an actual exposure processing process when the cell portion is formed of an L/S pattern with 71 nm as the design is. FIG. 9 shows a part (crooked portion at 45°) of the simulation image of FIG. 8 in an enlarged form.

It is understood from the simulation image shown in FIG. 8 that short circuits and disconnection generated in the prior art (FIG. 6) have not been generated. Namely, it has been understood that variations in dimensions are suppressed with respect to process variation, and the exposure margin of the interconnecting wiring has been greatly improved. Further, even when double pole illumination is used in place of quadrupole illumination, the same result has been obtained.

In accordance with the present embodiment, in order to dissolve the problem of the shortage of exposure margin for patterns with an intermediate pitch in an interconnecting wiring portion connecting to a peripheral circuit in projection exposure using double-pole illumination or quadrupole illumination, a mask pattern is formed in such a manner that the direction of the patterns in the wiring portion is deflected by 45° or 135° from the direction of the patterns of a cell array.

Consequently, an exposure condition can be set to be suitable for improving the resolution with respect to the patterns of the wiring portion, so that a great improvement in exposure margin can be realized. Accordingly, also when double-pole illumination and quadrupole illumination used specially for the miniaturization of patterns arrayed in directions at 0° and 90° are used, it is possible to solve the problem of a degradation in margin of a pattern in the wiring portion ranging from a minute pitch region to an eased pitch region at a peripheral portion, and an attempt can be made to improve a pattern accuracy.

Second Embodiment

Next, the inventors have more concretely made, as a second embodiment, the condition of application clear with respect to the line widths of the interconnecting wirings in the directions at 45° and 135° which have been used in the above-described first embodiment.

The inventors have carried out calculations of exposure margins of patterns arranged in a direction at 0° (or 90°) and patterns arranged in a direction at 45° (or 135°) in the illumination form shown in FIG. 5 and under the aforementioned exposure condition in order to establish a pitch of patterns forming the interconnecting wirings in a direction at 45° or 135° as rules. The results are shown in FIGS. 10 and 11.

Figure 10:
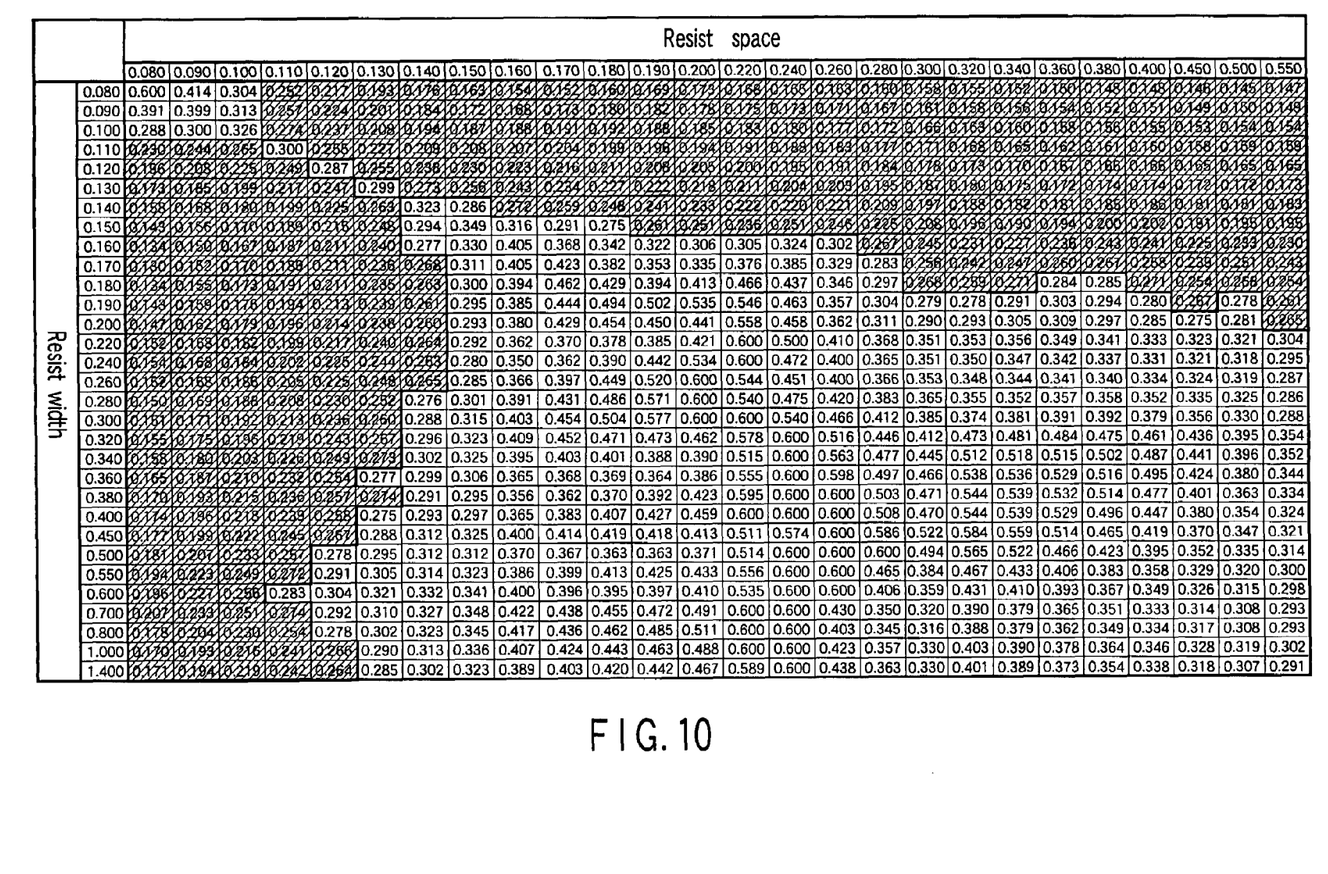
FIG. 10 is a diagram showing the dependence on resist dimensions and space dimensions, of an exposure margin of patterns arranged in a direction at 0° (or 90°) according to a second embodiment of the present invention.
Figure 12:
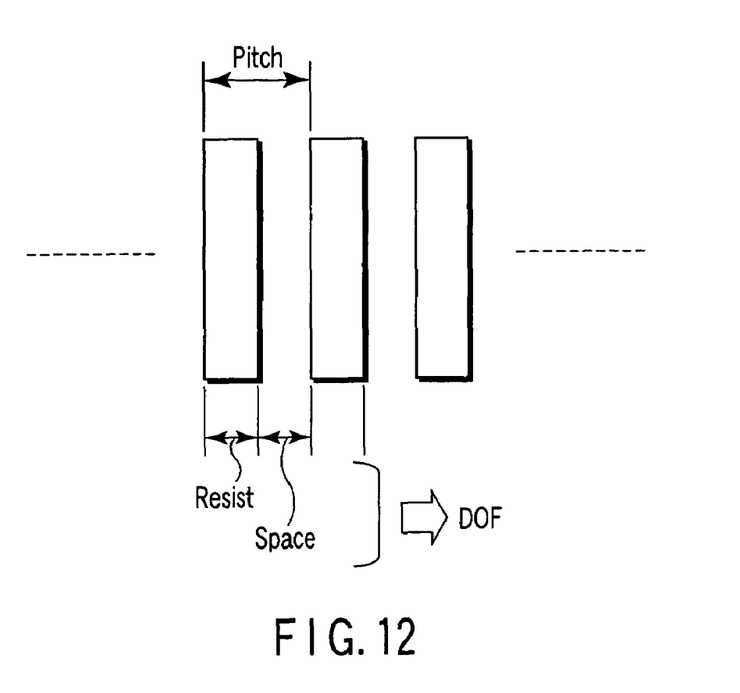
FIG. 12 is a view showing concrete patterns used for calculating the exposure margins shown in FIGS. 10 and 11.
Figure 13:
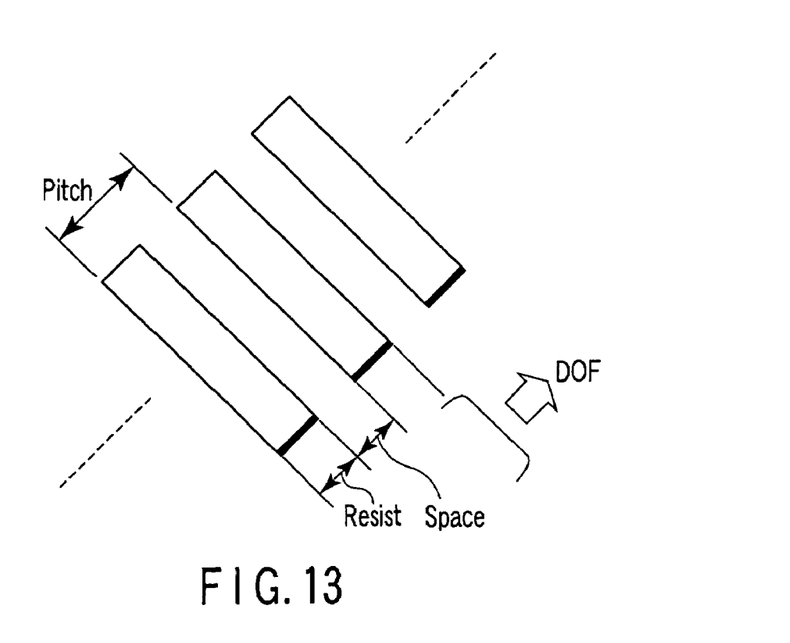
FIG. 13 is a view showing concrete patterns used for calculating the exposure margins shown in FIGS. 10 and 11.

FIG. 10 is a table showing the dependence on resist dimensions and space dimensions, of an exposure margin of patterns in a direction at 0° (or 90°). FIG. 11 is a table showing the dependence on resist dimensions and space dimensions, of an exposure margin of patterns in a direction at 45° (or 135°). Further, FIG. 12 shows concrete patterns used for calculating the exposure margins shown in FIG. 10. FIG. 13 shows concrete patterns used for calculating the exposure margins shown in FIG. 11. In the tables of FIGS. 10 and 11, the lines show sizes of resist patterns, columns show spaces between the resists, and the values in the tables show depths of focus (DOF) which are provided in a case of assuring an exposure amount tolerance of 8.5%.

Figure 11:
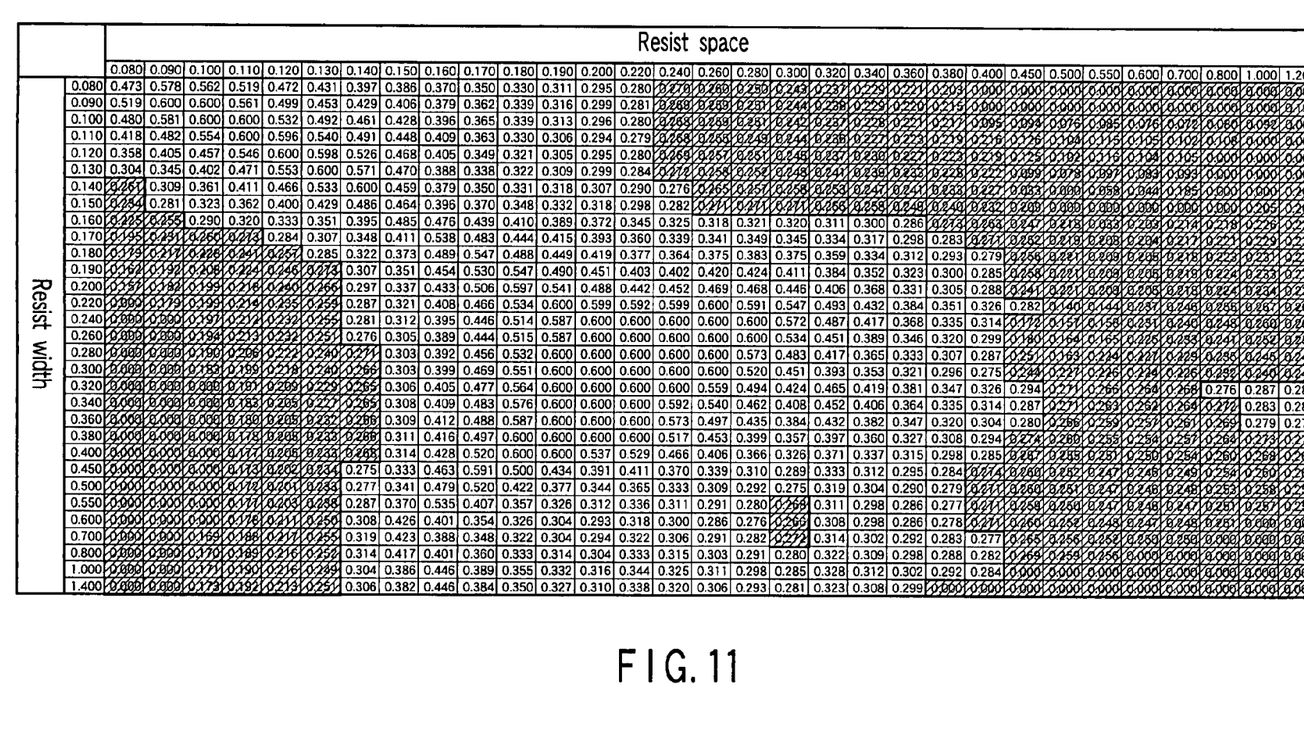
FIG. 11 is a diagram showing the dependence on resist dimensions and space dimensions, of an exposure margin of patterns arranged in a direction at 45° (or 135°) according to the second embodiment of the invention.

In FIGS. 10 and 11, hatchings are applied onto parts whose DOF is 0.227 μm or less, which show the regions whose margins are short on. It has been understood from the table of FIG. 10 that, in an layout in a direction at 0° (or 90°), in patterns whose resist sizes or resist spaces are 110 nm to 140 nm, the margins are markedly degraded even when the duties are slightly deflected from 1:1. This shows that, because more than a little of portions whose resist sizes or resist spaces are deflected from the duty of 1:1 exist, the margins are largely degraded. In contrast thereto, it has been understood from the table of FIG. 11 that, in a layout in a direction at 45° (or 135°), the margins can be sufficiently ensured in patterns whose resist sizes or resist spaces are 110 nm to 140 nm even when the duties are slightly deflected from 1:1.

The inventors have considered the possibility that a pattern condition under which an exposure margin is made short in a layout in a direction at 0° (or 90°) is expressed by dimensions standardized by λ/NA. As a result, it has been found out that, a deterioration in a margin is easily brought about in patterns with a pitch included within a range from a condition in which a zero-order light and a first-order diffracted light are, as shown by 201 in FIG. 14, positioned at a position where a distance from the optical axis is NA/3 when interference of light is two-beam interference, to a condition in which zero-order to second-order diffracted light move in the pupil as shown by 202 in FIG. 14 when interference of light is three-beam interference.

Figure 14:
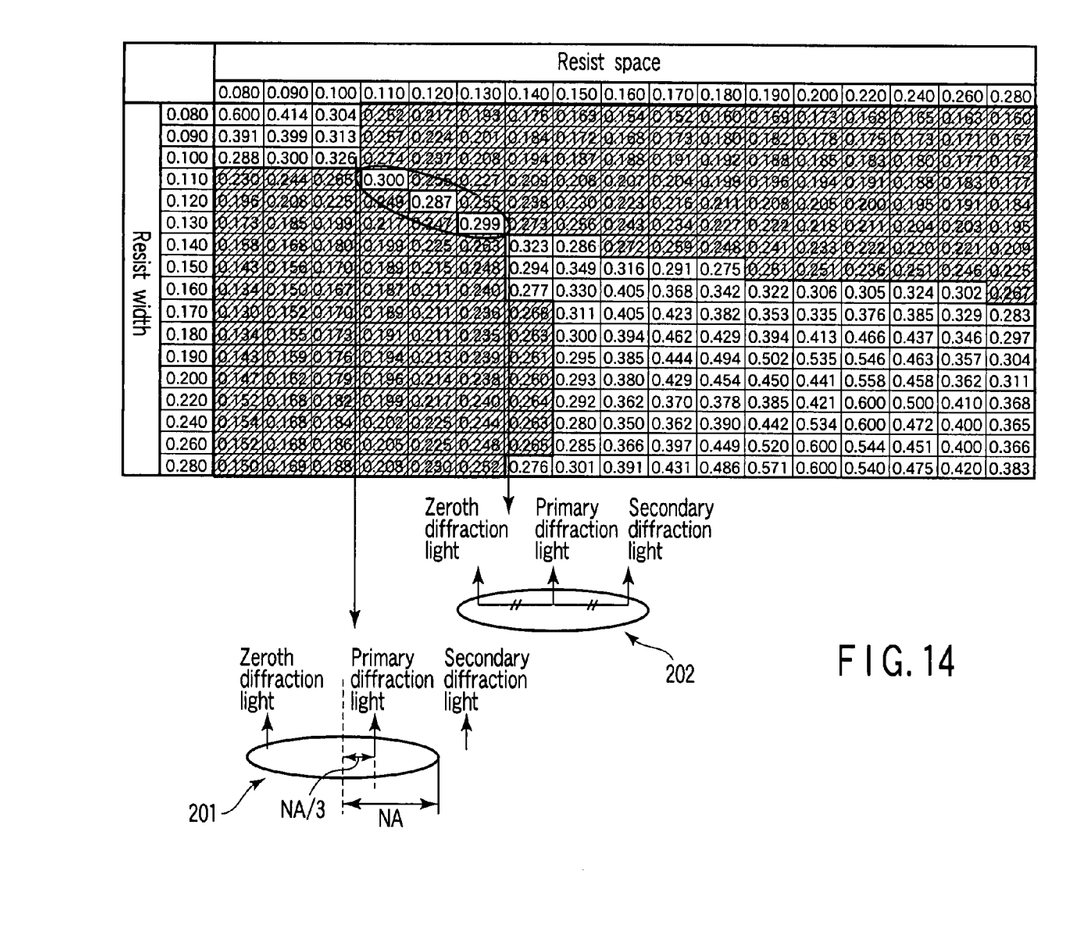
FIG. 14 is a diagram used for explanation for deriving a condition formula by which an exposure margin of patterns is deteriorated.

Then, to express the relationship by a mathematical expression, it can be expressed by the condition formula of:

$$\sigma_{cb} \cdot NA/\lambda \leq 1/p \leq (1/3 + \sigma_{cb}) \cdot NA/\lambda$$

where $\lambda$ is an exposure light wavelength of the exposure apparatus; NA is a numerical aperture of the exposure apparatus; and $\sigma_{cb}$ is a value when a light source having a longest distance from the optical axis to the point of the center of gravity among a plurality of light sources which sprinkle in double-pole illumination or quadrupole illumination is expressed by a ratio of NA.

Then, it has been understood that, when patterns with a pitch p satisfying the condition by the above-described condition formula are used, the patterns with the pitch p are arranged in a direction deflected by 45° or 135° from a direction of a pattern layout of a cell array, whereby not only a degradation in exposure margin can be reduced, but also an attempt can be made to improve a margin.

Note that the present invention is not limited to the respective embodiments described above. The respective embodiments have described a method of forming patterns of an interconnecting wiring portion, a mask on which a pattern is formed by the pattern forming method, and a method of manufacturing a semiconductor device using the mask. However, for example, in forming mask data, a function may be included, the function determining and displaying whether or not the target patterns are patterns with an exposure margin short on, based on determination results in a step of determining an exposure condition, a step of determining a layout direction of a cell pattern, and a step of determining whether or not target patterns satisfy the above formula. Further, a function of generating a layout deflected in a direction by 45° or 135° may be included in the mask data generating method. In this way, various modifications are possible.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mask pattern data forming method for forming pattern data of a photomask to be used for projection exposure by double-pole illumination or quadrupole illumination in which a light source intensity is concentrated in a double pole or quadrupole form, the method comprising:

arranging patterns with a minimum pitch in the pattern data in parallel or vertically in an X direction or a Y direction, where directions diagonally connected with respect to respective centers of gravity of the double-pole illumination or the quadrupole illumination are defined as the X direction and the Y direction; and arranging patterns or pattern groups whose exposure margins are smaller than that of the patterns with the minimum pitch in a direction deflected by 45° or 135° from the patterns with the minimum pitch, wherein a pitch p of the patterns or the pattern groups arranged in the direction deflected by 45° or 135° from the patterns with the minimum pitch satisfies a condition of:

$$\sigma_{cb} \cdot NA/\lambda \leq 1/p \leq (1/3 + \sigma_{cb}) \cdot NA/\lambda$$

where $\lambda$ is an exposure light wavelength of an exposure apparatus; NA is a numerical aperture of the exposure apparatus; and $\sigma_{cb}$ is a ratio of a distance between an optical axis and a point of center of a light source having a longest distance from the optical axis among a plurality of light sources which sprinkle in double-pole illumination or quadrupole illumination to numerical aperture NA.

2. A photomask which is used for projection exposure by double-pole illumination or quadrupole illumination in which a light source intensity is concentrated in a double-pole or quadrupole form, wherein patterns with a minimum pitch in the pattern data are formed in parallel or vertically in an X direction or a Y direction, where directions diagonally connected with respect to respective centers of gravity of the double-pole illumination or the quadrupole illumination are defined as the X direction and the Y direction; and patterns or pattern groups whose exposure margins are smaller than that of the patterns with the minimum pitch are arranged in a direction deflected by 45° or 135° from the patterns with the minimum pitch, wherein a pitch p of the patterns or the pattern groups formed in the direction deflected by 45° or 135° from the patterns with the minimum pitch satisfies a condition of:

$$\sigma_{cb} \cdot NA/\lambda \leq 1/p \leq (1/3 + \sigma_{cb}) \cdot NA/\lambda$$

where $\lambda$ is an exposure light wavelength of an exposure apparatus; NA is a numerical aperture of the exposure apparatus; and $\sigma_{cb}$ is a ratio of a distance between an optical axis and a point of center of a light source having a longest distance from the optical axis among a plurality of light sources which sprinkle in double-pole illumination or quadrupole illumination to numerical aperture NA.

3. The photomask according to claim 2, wherein the exposure apparatus is an ArF excimer laser exposure apparatus in which an exposure wavelength is 193 nm and NA=0.83.

* * * * *